(12) United States Patent
Deguchi et al.

(10) Patent No.: US 11,218,081 B2
(45) Date of Patent: Jan. 4, 2022

(54) POWER CONVERTER

(71) Applicant: DENSO CORPORATION, Kariya (JP)

(72) Inventors: Masataka Deguchi, Nagoya (JP); Akihiro Ueda, Nisshin (JP); Koji Yasui, Toyota (JP); Hirotaka Ohno, Miyoshi (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/832,048

(22) Filed: Mar. 27, 2020

(65) Prior Publication Data

US 2020/0321884 A1 Oct. 8, 2020

(30) Foreign Application Priority Data

Apr. 8, 2019 (JP) .............................. JP2019-073762

(51) Int. Cl.
 *H02M 7/00* (2006.01)
 *H05K 7/14* (2006.01)
 *H05K 7/20* (2006.01)

(52) U.S. Cl.
 CPC .......... *H02M 7/003* (2013.01); *H05K 7/1427* (2013.01); *H05K 7/2089* (2013.01)

(58) Field of Classification Search
 None
 See application file for complete search history.

(56) References Cited

U.S. PATENT DOCUMENTS

| | | | | |
|---|---|---|---|---|
| 8,451,609 | B2* | 5/2013 | Olesen | H01L 23/473 |
| | | | | 361/699 |
| 9,723,764 | B2* | 8/2017 | Sugita | H05K 7/20927 |
| 10,284,105 | B2* | 5/2019 | Hagimoto | H01L 21/4878 |
| 2005/0259402 | A1* | 11/2005 | Yasui | H05K 7/20927 |
| | | | | 361/716 |
| 2006/0284308 | A1* | 12/2006 | Harada | H01L 23/4012 |
| | | | | 257/729 |
| 2011/0194248 | A1 | 8/2011 | Nakasaka et al. | |
| 2011/0287285 | A1* | 11/2011 | Yoon | B60L 58/27 |
| | | | | 429/9 |
| 2014/0339693 | A1 | 11/2014 | Hotta | |
| 2015/0223366 | A1* | 8/2015 | Horiuchi | H02M 7/003 |
| | | | | 361/689 |
| 2016/0073556 | A1* | 3/2016 | Nakasaka | H01L 23/473 |
| | | | | 361/699 |
| 2016/0322281 | A1* | 11/2016 | Shintani | H01L 23/49838 |

(Continued)

FOREIGN PATENT DOCUMENTS

| | | |
|---|---|---|
| JP | 2011-103728 A | 5/2011 |
| JP | 5423654 B2 | 2/2014 |

(Continued)

*Primary Examiner* — Courtney L Smith
(74) *Attorney, Agent, or Firm* — Oliff PLC (57) ABSTRACT

A power converter includes: a plurality of power modules that houses semiconductor elements for electric power conversion; a pair of holding plates sandwiching a stacked body of the plurality of power modules in the first direction; a pair of connecting beams that connects the pair of holding plates respectively on both side ends of the stacked body in the second direction intersecting the first direction; and a substrate connected to control terminals of the power modules. At least one of the pair of holding plates is provided with a positioner to position the substrate.

6 Claims, 8 Drawing Sheets

(56) References Cited

U.S. PATENT DOCUMENTS

2017/0237358 A1 8/2017 Kraus et al.
2017/0325360 A1* 11/2017 Tanie ..................... H05K 13/00
2017/0331164 A1* 11/2017 Kwon ................. H01M 50/502

FOREIGN PATENT DOCUMENTS

JP 2017-085822 A 5/2017
KR 10-2014-0098805 A 8/2014

* cited by examiner

POWER CONVERTER

INCORPORATION BY REFERENCE

The disclosure of Japanese Patent Application No. 2019-073762 filed on Apr. 8, 2019 including the specification, drawings and abstract is incorporated herein by reference in its entirety.

BACKGROUND

1. Technical Field

The technology disclosed in the present specification relates to a power converter provided with a stacked body including a plurality of power modules that houses semiconductor elements for electric power conversion.

2. Description of Related Art

Japanese Patent Application Publication No. 2017-085822 (JP 2017-085822 A) and Japanese Patent Application Publication No. 2011-103728 (JP 2011-103728 A) disclose power converters each including a stacked body that includes a plurality of power modules and a plurality of coolers. The power converters disclosed in JP 2017-085822 A and JP 2011-103728 A are mounted in electric vehicles. A power converter is a device that converts electric power from a power source into driving power for a motor for traveling. Each of the plurality of power modules houses a semi conductor element for electric power conversion. A semiconductor element for electric power conversion generates a large amount of heat. The plurality of power modules and the plurality of coolers are alternately stacked one by one so as to cool each power module from its both sides. In order to set the power modules and the coolers in close contact with each other, the stacked body is pressurized in the stacking direction by a spring. One end of the stacked body in the stacking direction is pushed against an inner surface of the housing, and the spring applies pressure to the stacked body from the other end.

In the power converter disclosed in JP 2017-085822 A, control terminals extend from the respective power modules, and the control terminals of the plurality of power modules are connected to a substrate. Driving signals are sent from the substrate to the semiconductor elements of the power modules through the control terminals. The substrate is fixed to a housing of the power converter.

SUMMARY

In the power converter disclosed in JP 2017-085822 A, the stacked body and the substrate are separately fixed to the housing. When the power converter vibrates the stacked body (power modules) and the substrate are relatively displaced from each other, and a strong force may be applied to connected portions between the control terminals and the substrate. Further, when a relative positional error between the substrate and the stacked body is large, a strong force may also be applied to the connected portions between the control terminals and the substrate. If a strong force is applied to the connected portions between the control terminals and the substrate, a contact failure may be caused to the connected portions. In the power converter disclosed in JP 2017-085822 A, a space (gap) is secured between the substrate and the stacked body (power modules), and thus long control terminals are adopted. If the control terminals are long, the control terminals can be deformed depending on the relative displacement between the substrate and the stacked body (power modules), and a force generated at the connected portions between the control terminals and the substrate can be reduced. However, the space between the substrate and the stacked body (power modules) is a dead space. The present specification provides a technique capable of reducing a space between a substrate and a stacked body (power modules) while ensuring vibration resistance characteristics at connected portions between control terminals and the substrate.

A first aspect of the present disclosure is a power converter. The power converter includes: a plurality of power modules that houses semiconductor elements for electric power conversion; a pair of holding plates sandwiching a stacked body of the plurality of power modules in a first direction; a pair of connecting beams that connects the pair of holding plates at respective side ends of the stacked body in a second direction intersecting the first direction; and a substrate connected to control terminals of the power modules. At least one of the pair of holding plates is provided with a positioner to position the substrate. The control terminals extend in a third direction intersecting both the first direction and the second direction. The substrate is adjacent to the stacked body in the third direction.

According to the above first aspect the substrate is fixed to the pair of holding plates between which the stacked body is sandwiched. Since the relative position between the stacked body and the substrate is fixed via the pair of holding plates, the substrate and the stacked body (power modules) vibrate integrally. During the vibrations relative displacement between the stacked body (power modules) and the substrate is reduced. Further, the relative position of the substrate with respect to the stacked body (power modules) is also accurately fixed. Accordingly, even when the space between the power modules of the stacked body and the substrate is narrowed (that is, even when shorter control terminals are adopted), a strong force is prevented from being applied to the connected portions between the control terminals and the substrate.

In the first aspect the power converter may include a capacitor. The plurality of power modules may each include power terminals on a surface opposite to a surface where the control terminals are provided, and the capacitor may be connected to the power terminals of the plurality of power modules.

In the first aspect at least one of the pair of holding plates may be in contact with an inner surface of a housing that houses the stacked body.

In the first aspect the power converter may include an elastic member. Each of the pair of connecting beams may be divided into a first divided beam and a second divided beam in the first direction, and the first divided beam and the second divided beam may be connected to each other by the elastic member.

In the first aspect the power converter may include a spring. The spring may be compressed and held between one of the pair of holding plates and the stacked body.

In the first aspect the second direction may be orthogonal to the first direction, and the third direction may be orthogonal to both the first direction and the second direction.

In the first aspect the power converter may include a plurality of coolers stacked together with the plurality of power modules along the first direction. The stacked body may include the plurality of power modules and the plurality of coolers.

BRIEF DESCRIPTION OF THE DRAWINGS

Features, advantages and technical and industrial significance of exemplary embodiments of the disclosure will be described below with reference to the accompanying drawings, in which like numerals denote like elements, and wherein.

DETAILED DESCRIPTION OF EMBODIMENTS

A power converter 2 according to an embodiment will be described with reference to the drawings. The power converter 2 according to the embodiment is mounted in an electric vehicle. The power converter 2 is a device that converts electric power from a power source into driving power for a motor for traveling. The power converter 2 includes a plurality of power modules 10 that houses semiconductor elements for electric power conversion.

Figure 1:
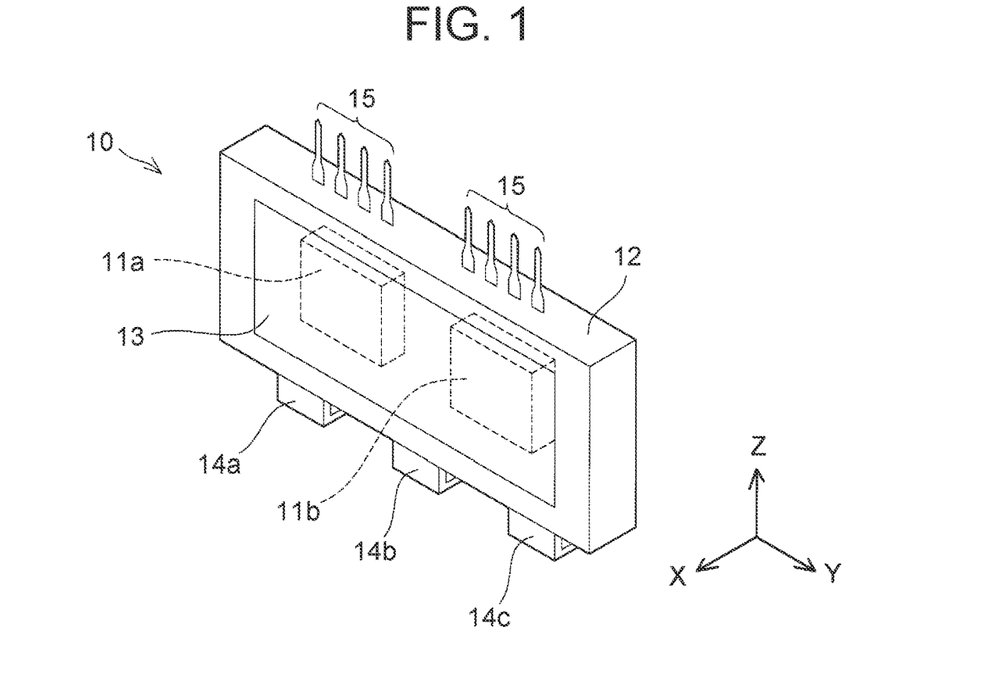
FIG. 1 is a perspective view of a power module adopted in a power converter according to an embodiment.
Figure 2:
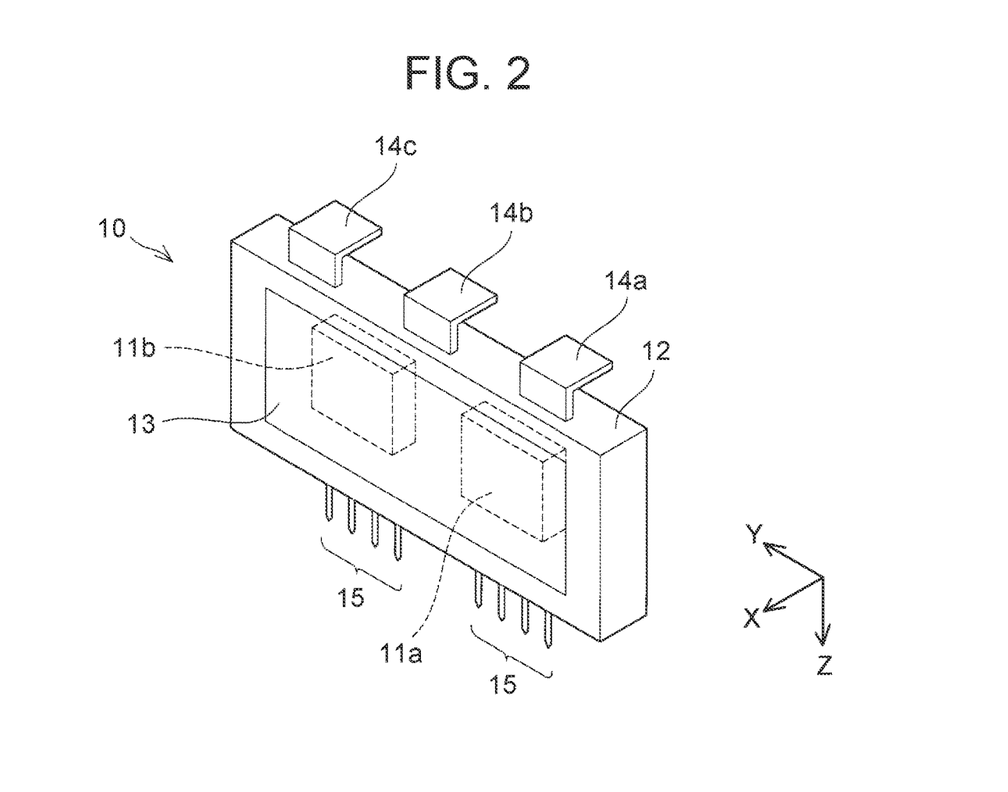
FIG. 2 is a perspective view of the power module adopted in the power converter according to the embodiment (obliquely viewed from below)

First the power module 10 will be described. FIG. 1 shows a perspective view of the power module 10. For convenience of explanation, the +Z direction in the coordinate system of the drawing is defined as the upward direction. FIG. 2 shows a perspective view of the power module 10 as obliquely viewed from below. Note that the orientations of the coordinate systems in FIG. 1 and FIG. 2 are different from each other.

Each of the power modules 10 houses two semiconductor elements 11a, 11b for electric power conversion. The semiconductor elements 11a, 11b are switching elements and are IGBTs (insulated gate bipolar transistors) or MOSFETs (metal oxide semiconductor field effect transistors). The semiconductor elements 11a, 11b may be switching elements other than IGBTs and MOSFETs. The semiconductor elements 11a, 11b may be composite devices in which the switching elements and diodes are connected in anti parallel.

The two semiconductor elements 11a, 11b are embedded in a resin package 12. The package 12 is flat; and heat sinks 13 are exposed to wide surfaces on both sides of the package 12. Each heat sink 13 is in contact with a cooler 21 described later, and efficiently transfers heat of the semiconductor elements 11a, 11b to the cooler 21.

The two semiconductor elements 11a, 11b are connected in series inside the package 12. Three power terminals 14a to 14c extend from a lower surface of the package 12. Positive and negative electrodes connected in series of the two semiconductor elements 11a, 11b are electrically connected to the power terminals 14a, 14b, respectively. The midpoint of the series connection is electrically conducted to the power terminal 14c.

A plurality of control terminals 15 extends from an upper surface of the package 12. The plurality of control terminals 15 is electrically connected to gate electrodes and temperature sensors of the semiconductor elements 11a, 11b.

By connecting three power modules 10 in parallel, an inverter that converts DC power into three-phase AC power can be realized.

Figure 3:
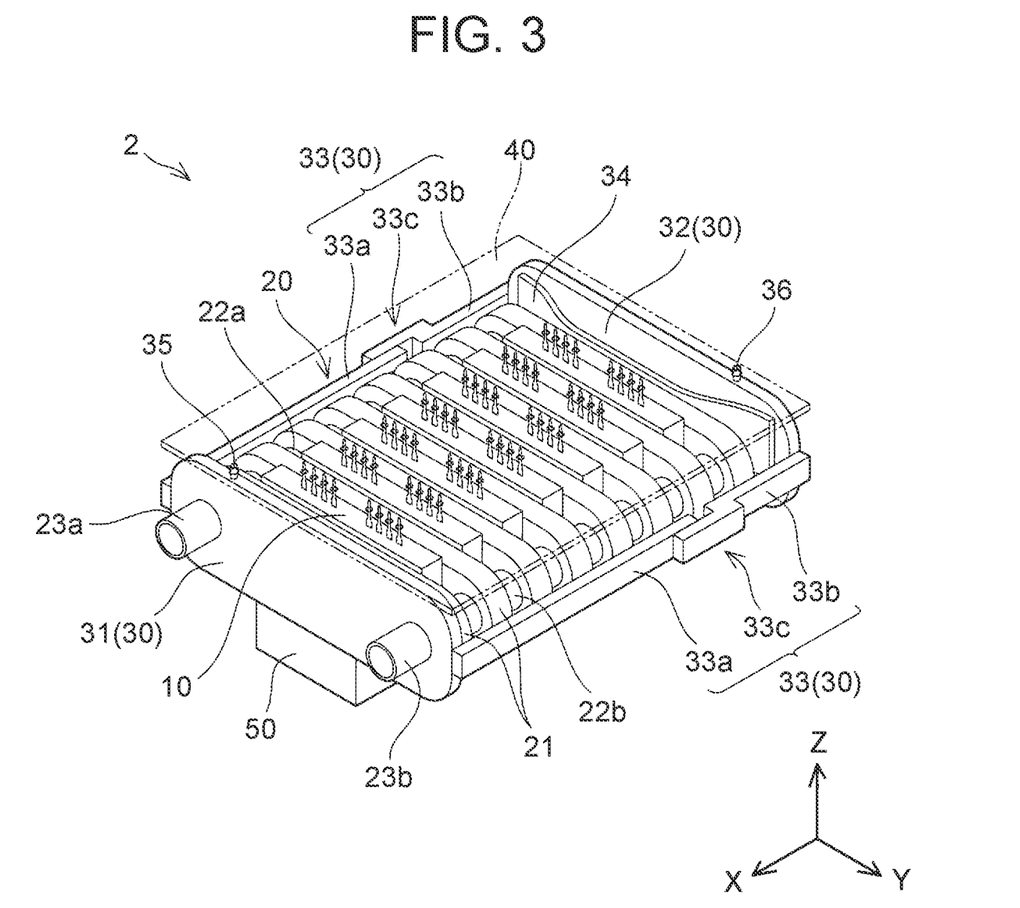
FIG. 3 is a perspective view of the power converter.

FIG. 3 shows a perspective view of the power converter 2. FIG. 3 shows only major components of the power converter 2, and illustration of the housing of the power converter 2 as well as other devices housed in the housing is omitted.

The power converter 2 includes a plurality of power modules 10, a plurality of coolers 21, a substrate 40, and a capacitor 50. In FIG. 3, the substrate 40 is illustrated with imaginary lines.

The power converter 2 includes seven power modules 10. In FIG. 3, reference numeral 10 is added only to a leftmost power module 10, and reference numerals for the remaining power modules are omitted. As described above, an inverter can be configured by connecting three power modules 10 in parallel. Seven power modules 10 are used for configuring two sets of inverters and one voltage converter. One power module 10 is used for configuring one voltage converter.

The plurality of power modules 10 and the plurality of coolers 21 are alternately stacked one by one. In FIG. 3, only a pair of coolers 21 with the leftmost power module 10 interposed therebetween is denoted by the reference numeral, and the reference numerals for the remaining coolers are omitted. The plurality of power modules 10 and the plurality of coolers 21 constitute a stacked body 20. The stacked body 20 is not always necessary to be configured by the plurality of power modules 10 and the plurality of coolers 21, and may be configured by only the plurality of power modules 10, for example. The X direction in the coordinate system of the drawing corresponds to a stacking direction of the plurality of power modules 10 and the plurality of coolers 21. Hereinafter, for convenience of explanation, the stacking direction (X direction) of the plurality of power modules 10 and the plurality of coolers 21 may be simply referred to as a stacking direction in some cases.

Each pair of coolers 21 between which the power module 10 is sandwiched are connected to each other by two connecting pipes 22a, 22b. The inside of the cooler 21 is configured as a flow path through which a coolant flows, and the two connecting pipes 22a, 22b provide communication between the flow paths of the adjacent coolers 21. Each pair of coolers 21 is connected by the two connecting pipes 22a, 22b. The two connecting pipes 22a, 22b are arranged such that the power module 10 is sandwiched therebetween in the Y direction in the coordinate system of the drawing. In FIG. 3, only one set of connecting pipes are denoted by reference numerals 22a, 22b, and reference numerals for the remaining connecting pipes are omitted.

The cooler 21 located at one end in the stacking direction of the stacked body 20 is provided with a supply pipe 23a and a discharge pipe 23b. The supply pipe 23a and the discharge pipe 23b are connected to a coolant circulation device (not shown). The coolant supplied from the supply pipe 23a is distributed to all the coolers 21 through the connecting pipes 22a The coolant absorbs heat of the power modules 10 while flowing through the flow paths inside the coolers 21. As described above, the heat sink 13 is exposed on the surface of the package 12 of each power module 10, and the coolant absorbs the heat of the semiconductor elements 11a, 11b through the heat sink 13. The coolant that has absorbed the heat returns to the coolant circulation device through the connecting pipes 22b and the discharge pipe 23b.

Figure 4:
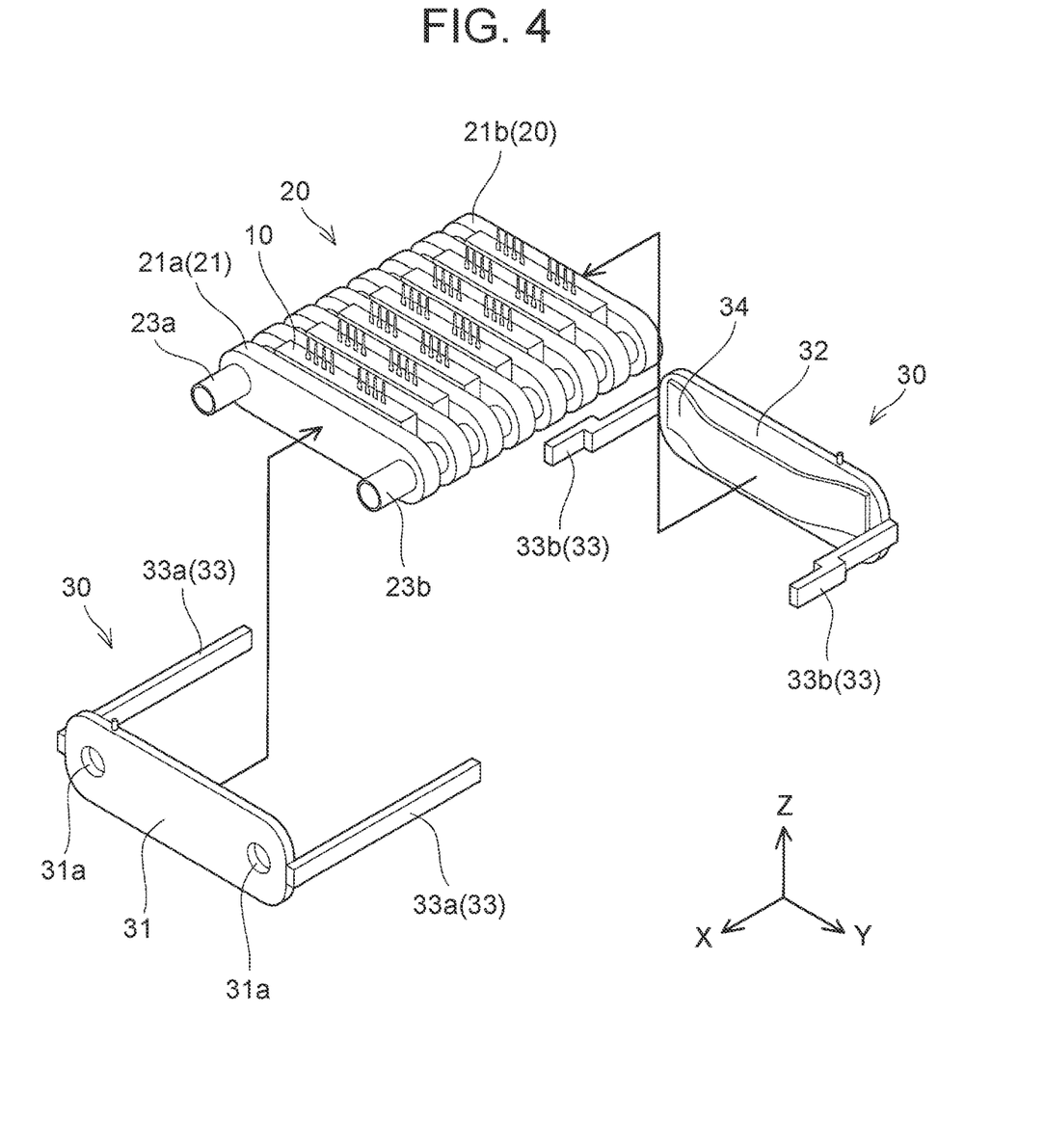
FIG. 4 is an exploded view of a stacked body and a frame.

The stacked body 20 is restrained by a frame 30. The frame 30 surrounds the stacked body 20. The frame 30 includes a pair of holding plates 31, 32 and a pair of connecting beams 33. FIG. 4 shows an exploded view of the stacked body 20 and the frame 30. The frame 30 will be described with reference to FIG. 4 together with FIG. 3. In FIG. 4, a cooler 21 located on one end side in the stacking direction is referred to as a cooler 21a, and a cooler 21 located on the other end side is referred to as a cooler 21b for the purpose of distinguishing these coolers.

The pair of holding plates 31, 32 is arranged such that the stacked body 20 is sandwiched therebetween in the stacking direction (X direction). The holding plate 31 is in contact with the cooler 21a on the one end side of the stacked body 20, and the holding plate 32 faces the cooler 21b on the other end side of the stacked body 20 via a leaf spring 34. The holding plate 31 is provided with a pair of through-holes 31a, and the supply pipe 23a is inserted through one through-hole 31a, and the discharge pipe 23b is inserted through the other through-hole 31a.

The pair of holding plates 31, 32 is connected by a pair of connecting beams 33 at both side ends in the Y direction of the stacked body 20. The pair of connecting beams 33 is arranged such that the stacked body 20 is sandwiched therebetween in the Y direction. The stacked body 20 is surrounded by the pair of holding plates 31, 32 and the pair of connecting beams 33.

Each connecting beam 33 is divided into a first divided beam 33a connected to the holding plate 31, and a second divided beam 33b connected to the holding plate 32. A front end of the first divided beam 33a and a front end of the second divided beam 33b are joined by welding. In FIG. 3, reference numeral 33c indicates a joint location. FIG. 4 shows the frame 30 before the first divided beam 33a and the second divided beam 33b are joined to each other.

As described above, the leaf spring 34 is held between the cooler 21b and the holding plate 32 at the one end of the stacked body 20. The first divided beam 33a and the second divided beam 33b are joined to each other in a state in which the stacked body 20 is pressurized in the stacking direction by the leaf spring 34. That is, the frame 30 holds the stacked body 20 in a pressurized state. In other words the frame 30 restrains the leaf spring 34 and the stacked body 20 together in a state in which the leaf spring 34 is compressed. The pressurization of the leaf spring 34 brings the coolers 21 and the power modules 10 to come into strong contact with each other, and the heat is well transmitted from the power modules 10 to the coolers 21.

Figure 5:
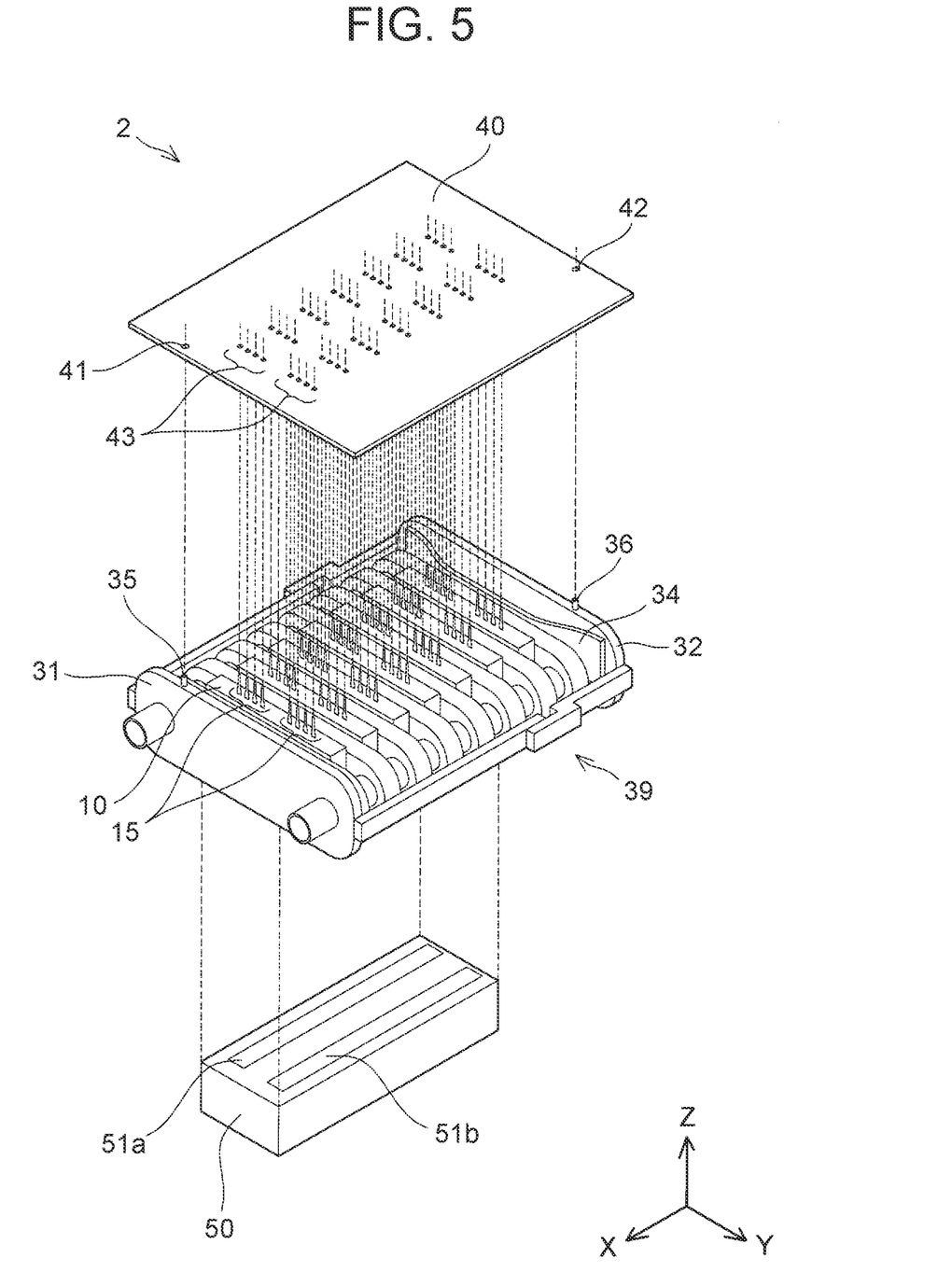
FIG. 5 is an exploded view of the stacked body, and a frame assembly, a substrate, and a capacitor.

The assembly of the stacked body 20 and the frame 30 is referred to as an assembly 39. A substrate 40 is fixed on the assembly 39, and a capacitor 50 is fixed under the assembly. FIG. 5 shows an exploded view of the assembly 39, the substrate 40, and the capacitor 50. Hereinafter, the structure of the power converter 2 will be described with reference to FIG. 3 and FIG. 5.

Circuits for control ling the semi conductor elements 11a, 11b housed in the power modules 10 are mounted on the substrate 40. Various chips such as a memory and an arithmetic unit are mounted on the substrate 40; however, illustration of these chips is omitted. The control circuits mounted on the substrate 40 generates driving signals for the semiconductor elements 11a, 11b based on commands sent from a host controller (not shown). The substrate 40 is provided with many through-holes 43, and the control terminals 15 of the power modules 10 are connected to the respective through-holes 43. Printed wiring (not shown) on the substrate 40 is connected to each through-hole 43. The semiconductor elements 11a, 11b and the control circuits are electrically connected through the control terminals 15 and the through-holes 43.

The driving signals generated by the control circuit are sent to the semiconductor elements 11a, 11b through the through-holes 43 and the control terminals 15. As described above, some of the control terminals 15 are connected to the sensors included in the power modules 10, and sensor signals are also sent to the control circuits mounted on the substrate 40 through the control terminals 15 and the through-holes 43. Based on the sensor data the control circuits control electric power flowing through the semiconductor elements 11a, 11b so as to prevent overheat of the semi conductor elements 11a, 11b.

As shown in FIG. 3 and FIG. 5, the control terminal 15 extends upward of the power module 10, and the substrate 40 is disposed adjacent to the assembly 39 on the upper side of the assembly 39.

The substrate 40 is fixed to the holding plates 31, 32 of the frame 30. A protrusion 35 for fixing a relative position of the substrate 40 with respect to the holding plate 31 is provided on the upper surface of the holding plate 31, and a protrusion 36 for positioning the substrate 40 is also provided on the upper surface of the holding plate 32. The substrate 40 is formed with a fitting hole 41 (42) corresponding to the protrusion 35 (36) of the holding plate 31 (32). The protrusion 35 (36) of the holding plate 31 (32) is fitted into the fitting hole 41 (42) of the substrate 40 so as to fix the relative position of the substrate 40 with respect to the holding plates 31, 32 (that is, the assembly 39), and also to fix the substrate 40 to the holding plates 31, 32 (that is the assembly 39).

Description will be provided on advantages of positioning and fixing the substrate 40 to the holding plates 31, 32. The substrate 40 is fixed to the holding plates 31, 32 (that is the assembly 39); therefore, when the power converter 2 vibrates the substrate 40 and the power module 10 vibrate together. When the substrate 40 and the stacked body 20 (power modules 10) are separately fixed to the housing, a difference is generated between the vibration of the substrate 40 and the vibration of the stacked body 20 (power modules 10). When the substrate 40 and the stacked body 20 (power modules 10) vibrate separately, a high stress may be caused to portions where the control terminals and the through-holes 43 are in contact with each other. In another case, when the substrate 40 and the assembly 39 are separately fixed to the housing, a positional error occurs between the control terminals 15 and the through-holes 43, and thus a high stress may be caused to the control terminals 15 resulting from the positional error.

When a high stress is caused in the control terminals 15, a poor contact may occur between the control terminals 15 and the through-holes 43. In order to relieve a high stress, it is necessary to adopt long control terminals to allow deformation of the control terminals 15. However, if long control terminals are adopted, a useless space is created between the stacked body 20 (power modules 10) and the substrate 40.

On the other hand, in the power converter 2 of the embodiment the substrate 40 is accurately positioned with respect to the assembly 39. In addition, since the substrate 40 is fixed to the assembly 39, the substrate 40 and the assembly 39 (power modules 10) vibrate together. Therefore, a high stress is prevented from being caused to the portions where the control terminals 15 and the through-holes 43 are in contact with each other. Since a high stress is prevented from occurring, short control terminals 15 can be adopted, and thus a useless space between the power modules 10 and the substrate 40 can be reduced.

Figure 6:
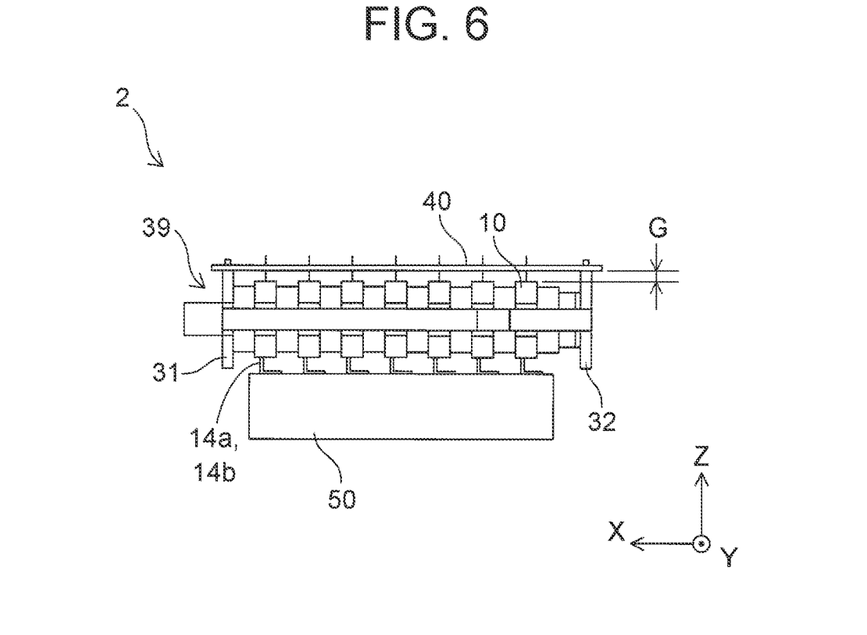
FIG. 6 is a side view of the power converter.

FIG. 6 shows a side view of the power converter 2. As shown in FIG. 6, a space (gap G) between the power module 10 and the substrate 40 is small. Note that it is sufficient for the upper surfaces of the holding plates 31, 32 to be slightly higher than positions of the upper surfaces of the power modules 10.

A capacitor 50 is arranged under the assembly 39. Each power module 10 has the power terminals 14a, 14b on the surface (lower surface) opposite to the surface (upper surface) on which the control terminals 15 are provided in the Z direction in the coordinate system of the drawing, and the capacitor 50 is connected to the power terminals 14a, 14b.

As shown in FIG. 5, a first terminal 51a and a second terminal 51b are exposed on the upper surface of the capacitor 50. The first terminal 51a of the capacitor 50 is connected to the positive power terminals 14a of the plurality of power modules 10, and the second terminal 51b of the capacitor 50 is connected to the negative power terminals 14b of the power modules 10. The power terminals 14a, 14b extend downward and bend in the middle in the X direction. The bent ends of the power terminals 14a, 14b are connected to the terminals 51a, 51b of the capacitor 50. The capacitor 50 is provided to reduce switching noise of the semiconductor elements 11a, 11b housed in the power modules 10.

Figure 7:
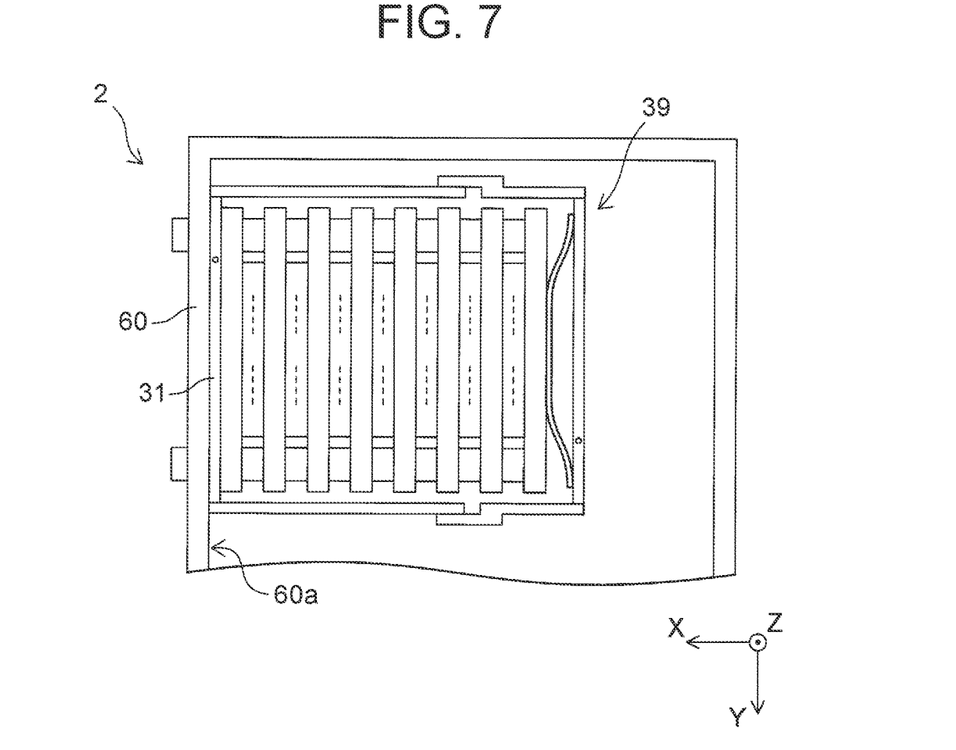
FIG. 7 is a plan view of the power converter (with a housing)

FIG. 7 shows a plan view of the power converter 2. FIG. 7 also illustrates a housing 60 that houses the assembly 39. In FIG. 7, illustration of the substrate 40, the capacitor 50, and other devices housed in the housing 60 is omitted. The holding plate 31 is in contact with an inner surface 60a of the housing 60. Since the stacked body 20 is restrained by the frame 30, it is unnecessary to provide a useless space between the frame 30 and the inner surface 60a The holding plate 32 may be in contact with an inner surface of the housing 60.

Figure 8:
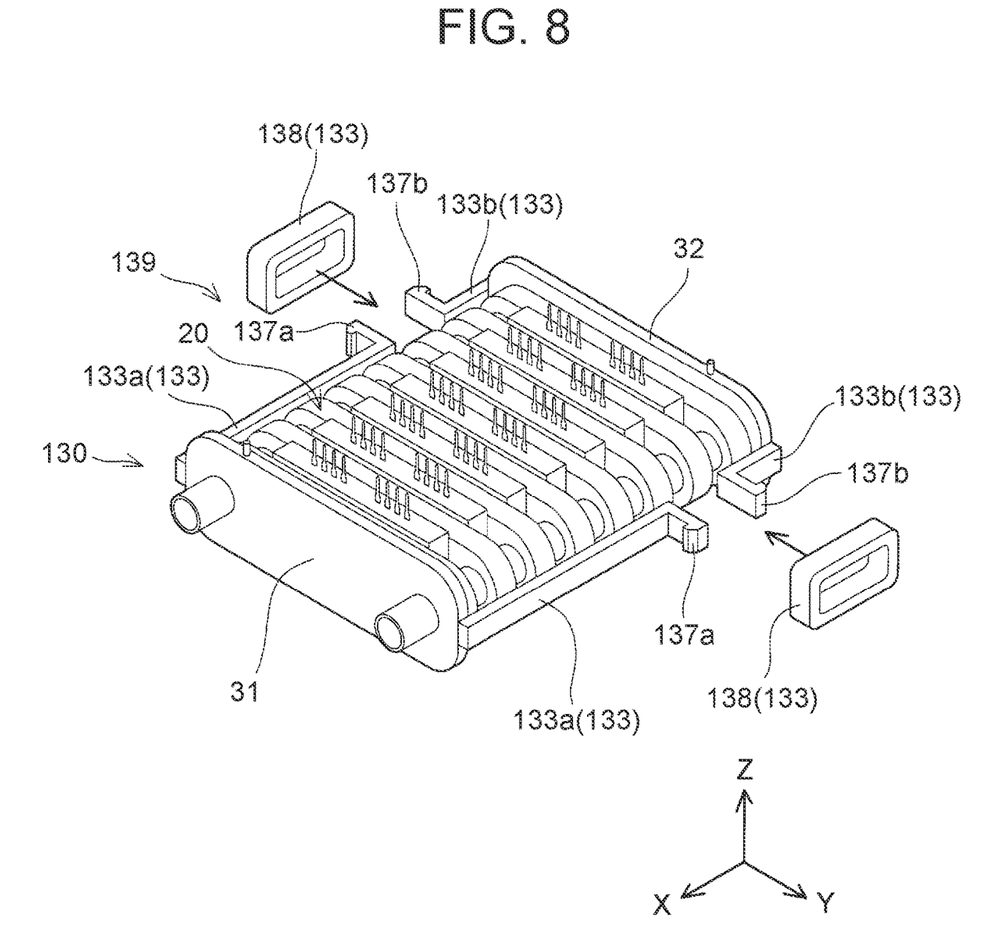
FIG. 8 is a perspective view of a modification of the frame and an assembly of the stacked body (a view in which a restraining ring is removed)
Figure 9:
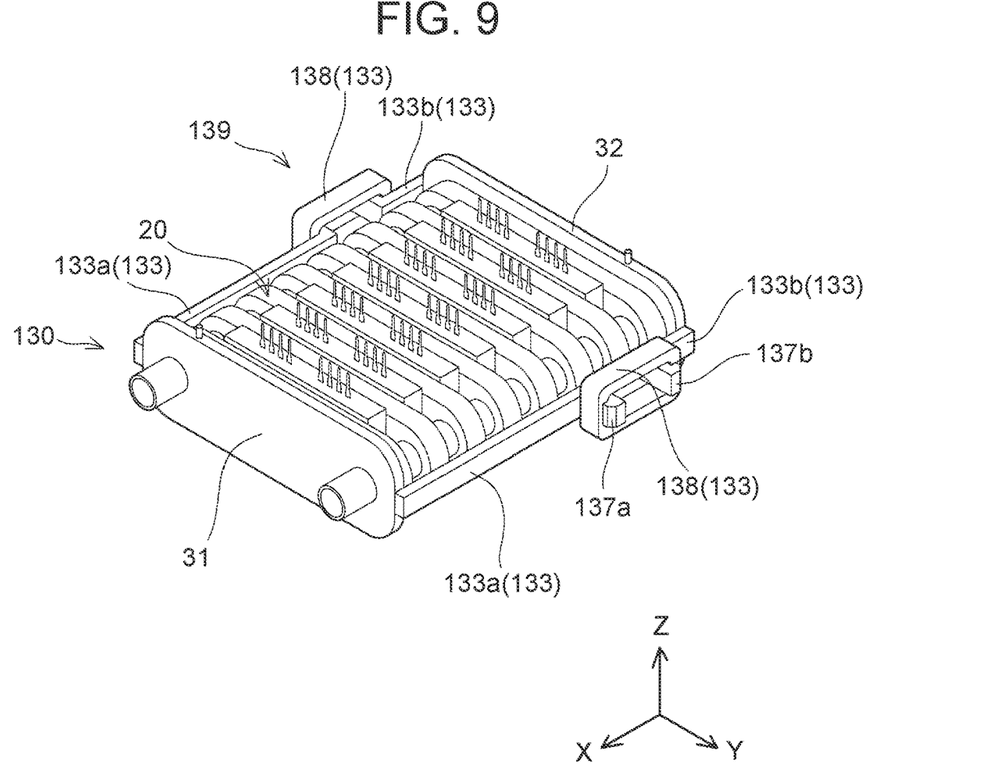
FIG. 9 is a perspective view of the modification of the frame and the assembly of the stacked body (a view in which the restraining ring is attached)

Next a modification of the frame will be described. FIG. 8 and FIG. 9 show perspective views of an assembly 139 of a modified frame 130 and the stacked body 20. FIG. 8 is a view showing that a restraining ring 138 (described later) is removed, and FIG. 9 is a view showing that the restraining ring 138 is attached.

The frame 130 includes: a pair of holding plates 31, 32 disposed such that the stacked body 20 is sandwiched therebetween in the stacking direction; and a pair of connecting beams 133 that connects the holding plates 31, 32. The pair of connecting beams 133 is located on both sides of the stacked body 20 in the Y direction in the coordinate system of the drawing. Each connecting beam 133 is divided into a first divided beam 133a and a second divided beam 133b in the stacking direction (X direction). The first divided beams 133a are connected to the holding plate 31, and the second divided beams 133b are connected to the holding plate 32.

A hook 137a is provided at a front end of the first divided beam 133a located on the second divided beam 133b side. A hook 137b is provided at a front end of the second divided beam 133b located on the first divided beam 133a side. A restraining ring 138 is attached so as to surround the hooks 137a, 137b. The first divided beam 133a and the second divided beam 133b on each side are connected to each other by the restraining ring 138. The first divided beam 133a, the second divided beam 133b, and the restraining ring 138 configure each connecting beam 133.

The restraining ring 138 is made of an elastic body. The restraining ring 138 connects the first divided beam 133a and the second divided beam 133b in a state where the holding plates 31, 32 pressurize the stacked body 20. Employment of the restraining ring 138 made of an elastic member eliminates the leaf spring 34 provided to the power converter 2 of the embodiment. Since the leaf spring 34 becomes unnecessary, the length of the assembly 139 in the X direction (stacking direction) can be shortened.

Figure 10:
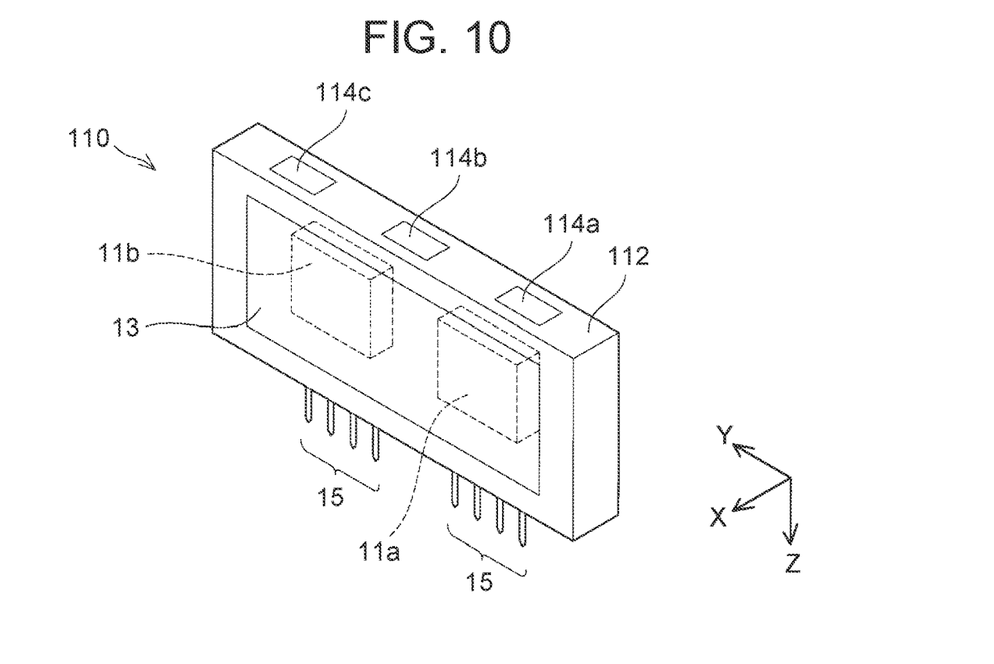
FIG. 10 is a perspective view of a modification of the power module (obliquely viewed from below)

A modification of the attachment method of the capacitor 50 will be described. FIG. 10 shows a perspective view of a power module 110 according to the modification as viewed from below. In the power module 110, power terminals 114a to 114c are exposed on a lower surface of a package 112. The power terminals 114a to 114c are flush with the lower surface of the package 112.

Figure 11:
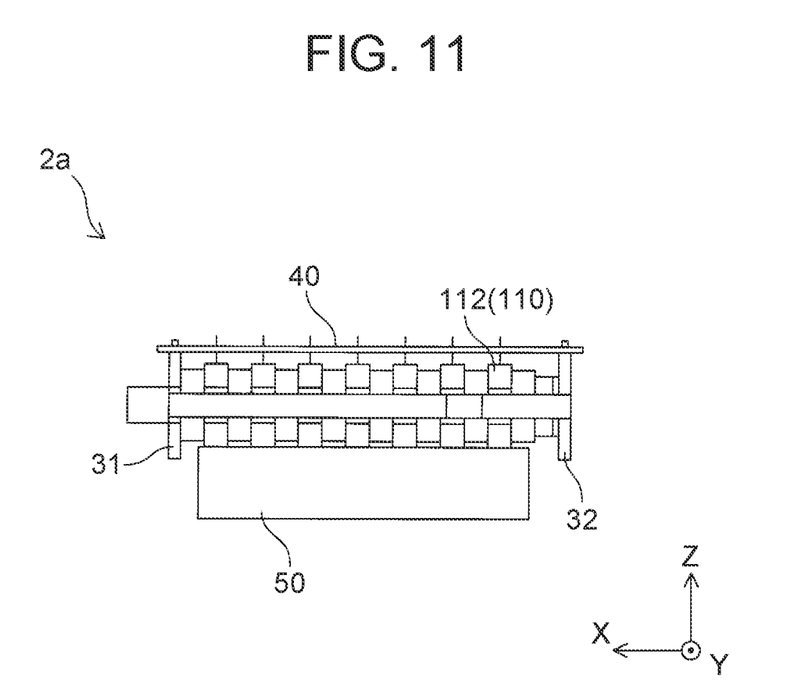
FIG. 11 is a side view of a power converter in which the modification of the power module is adopted.

FIG. 11 shows a side view of a power converter 2a using the power module 110. Since the power terminals 114a to 114c are exposed on the lower surface of the package 112 in flush with this lower surface, the capacitor 50 is attached to the lower surface of the package 12. As the capacitor 50 is attached to the lower surface of the package 112, the power terminals 114a, 114b are electrically connected to the terminals 51a, 51b (see FIG. 5) of the capacitor 50. In the power converter 2a, the capacitor 50 can be arranged closer to the package 112 of the power module 110. Since a distance between the substrate 40 and the package 112 becomes shorter, the power converter 2a can be reduced in length in the Z direction.

Remarks regarding the technology described in the above embodiments will be described. In the power converter 2 of the embodiments the holding plates 31, 32 are provided respectively with the protrusions 35, 36 for positioning the substrate 40, and the fitting holes 41, 42 into which the protrusions 35, 36 are respectively fitted are formed on the substrate 40. Alternatively, protrusions may be provided on the substrate 40, and grooves for positioning the protrusions of the substrate 40 may be provided on the holding plates 31, 32. The protrusions or grooves that position the substrate are preferably provided on both of the pair of holding plates 31, 32, but it is sufficient that the protrusions or grooves are provided on at least one of the holding plates 31, 32. The fitting holes 41, 42 may be screw grooves, and screws may be inserted into the screw grooves so as to carry out the positioning. The protrusions 35, 36 may be hooks and the hooks may be hooked into the fitting holes 41 and 42 so as to carry out the positioning.

The protrusions or the grooves for positioning the substrate is an example of a positioner. The positioner for positioning the substrate 40 may be hooks or screws in addition to the protrusions or the grooves.

The capacitor 50 may be disposed next to the stacked body 20 in the Y direction in the coordinate system of the drawings.

The X direction (stacking direction) in the coordinate system of the drawings is an example of a first direction, the Y direction is an example of a second direction, and the Z direction is an example of a third direction. The Y direction may be orthogonal to the X direction, and the Z direction may be orthogonal to both the X direction and the Y direction.

As described above, specific examples of the present disclosure have been described in detail, but these are merely examples and do not limit the scope of the claims.

The technology described in the claims includes various modifications and changes of the specific examples exemplified above. The technical elements described in the present specification or the drawings exhibit technical usefulness alone or in various combinations, and are not limited to the combinations described in the claims at the time of filing. In addition, the technology exemplified in the present specification or the drawings can achieve a plurality of objects at the same time, and has technical usefulness by achieving one of the objects.

What is claimed is:

1. A power converter comprising:
a plurality of power modules that houses semiconductor elements for electric power conversion;
a pair of holding plates sandwiching a stacked body of the plurality of power modules in a first direction;
at least one elastic member;
a pair of connecting beams that connects the pair of holding plates at respective side ends of the stacked body in a second direction intersecting the first direction, each of the pair of connecting beams being divided into a first divided beam and a second divided beam in the first direction, the first divided beams and the second divided beams being connected to each other by the at least one elastic member;
a substrate connected to control terminals of the power modules, the control terminals extending in a third direction intersecting both the first direction and the second direction, the substrate being adjacent to the stacked body in the third direction; and
a positioner to position the substrate provided with at least one of the pair of holding plates.

2. The power converter according to claim 1 further comprising a capacitor, wherein:
the plurality of power modules each include power terminals on a surface opposite to a surface where the control terminals are provided; and
the capacitor is connected to the power terminals of the plurality of power modules.

3. The power converter according to claim 1, wherein at least one of the pair of holding plates is in contact with an inner surface of a housing that houses the stacked body.

4. The power converter according to claim 1, further comprising a spring, wherein
the spring is compressed and held between one of the pair of holding plates and the stacked body.

5. The power converter according to claim 1, wherein:
the second direction is orthogonal to the first direction; and
the third direction is orthogonal to both the first direction and the second direction.

6. The power converter according to claim 1, further comprising
a plurality of coolers stacked together with the plurality of power modules along the first direction, wherein
the stacked body includes the plurality of power modules and the plurality of coolers.

* * * * *